United States Patent [19]

Masuko et al.

[11] Patent Number: 6,051,368

[45] Date of Patent: Apr. 18, 2000

[54] RADIATION SENSITIVE COMPOSITION CONTAINING A DISPERSED PHOSPHOR

[75] Inventors: Hideaki Masuko, Akahoriminami-machi; Jiro Takahashi, Mie; Tadahiko Udagawa, Mie; Atsushi Kumano, Mie, all of Japan

[73] Assignee: JSR Corporation, Tokyo, Japan

[21] Appl. No.: 09/037,066

[22] Filed: Mar. 9, 1998

[30] Foreign Application Priority Data

Mar. 17, 1997 [JP] Japan ..................................... 9-082402

[51] Int. Cl.[7] ............................. G03C 1/725; G03C 1/73; G03F 7/028; G03F 7/032
[52] U.S. Cl. ........................ 430/288.1; 340/911; 340/910; 340/28; 340/281.1
[58] Field of Search ..................... 430/911, 910, 430/285.1, 288.1, 197, 195, 28, 270.1, 281.1; 522/88

[56] References Cited

U.S. PATENT DOCUMENTS

| | | | |
|---|---|---|---|
| 4,208,448 | 6/1980 | Panaccione | 427/67 |
| 4,608,301 | 8/1986 | Ishizuka et al. | 428/328 |
| 4,752,717 | 6/1988 | Mental | 313/511 |
| 5,368,976 | 11/1994 | Tajima et al. | 430/176 |
| 5,858,616 | 1/1999 | Tanaka et al. | 430/28 |

FOREIGN PATENT DOCUMENTS

| | | |
|---|---|---|
| 2-99585 | 4/1990 | Japan . |
| 4-116558 | 4/1992 | Japan . |
| 5-205627 | 8/1993 | Japan . |
| 5-205632 | 8/1993 | Japan . |
| 5-205633 | 8/1993 | Japan . |
| 6-251703 | 9/1994 | Japan . |
| 8-17344 | 1/1996 | Japan . |

OTHER PUBLICATIONS

Anadasiva et al. Access No. 1986–056356, On Line Derwent West 1–0, File DWPI, English Abstract of DE 3429489A, Published Feb 20, 1986.

*Primary Examiner*—Janet Baxter
*Assistant Examiner*—Sin J. Lee
*Attorney, Agent, or Firm*—Oblon, Spivak, McClelland, Maier & Neustadt, P.C.

[57] ABSTRACT

A radiation sensitive composition comprising (1) a phosphor; (2) an organic polymer binder comprising a combination of at least one alkali-soluble resin and at least one cellulose ether; (3) a photo-crosslinkable compound; and (4) a photo-radical generating agent.

9 Claims, No Drawings

RADIATION SENSITIVE COMPOSITION CONTAINING A DISPERSED PHOSPHOR

DETAILED DESCRIPTION OF THE INVENTION

This invention relates to a radiation sensitive composition containing a dispersed phosphor and, more specifically, to a radiation sensitive composition containing a phosphor dispersed therein, which can form a uniform fluorescent screen on a substrate and side surfaces of partitions of a plasma display panel, in particular.

Among flat panel display devices, a plasma display panel (PDP) attracts more attention because it has such characteristic features as easy production process, a wide viewing angle, a self emitting type, high display quality and the like in spite that it is a large-sized panel. Particularly, a color PDP is expected to become a main stream of the market as a display device for a 20-inch or more large-sized wall type high-definition TV (HDTV) in the near future.

In the color PDP, color display is effected by generating ultraviolet light by means of a gas discharge to cause a phosphor to emit light. Generally speaking, three fluorescent screens for emitting red light, green light and blue light are provided on a substrate, and pixel units of respective colors are present in a uniformly mixed state as a whole.

Describing the color PDP in more detail, a plurality of partitions made from an insulating material, which are called "barrier rib", are formed on the surface of a substrate made from glass or the like so that a large number of recesses are defined by the partitions. In each recess, a fluorescent screen is provided and an electrode for applying plasma to the fluorescent screen is arranged. Thus, a pixel unit is formed in each fluorescent screen.

As a method for producing such a color PDP, there are known, for example, a screen printing method in which a pasty phosphor composition is arranged by a screen printing to form a fluorescent screen in each pixel unit domain on the surface of a substrate, and a photolithography method in which a radiation sensitive phosphor composition layer is formed, irradiated with ultraviolet light through a mask, and developed to form a phosphor screen in each pixel unit domain on the surface of a substrate. Particularly, the photolithography method facilitates the formation of a fine pattern and is expected to be used in the field of a high-performance color PDP. For this purpose, the development of a radiation sensitive composition containing a dispersed phosphor is being made assiduously.

This radiation sensitive composition containing a dispersed phosphor is a pasty composition containing a dispersed phosphor, as exemplified by a known composition comprising a phosphor dispersed in a vehicle such as a mixture of a polyvinyl alcohol and a diazonium compound or a dichromic acid compound or a mixture of gelatin and an organic curing agent (see JP-A 5-205632) (the term "JP-A" as used herein means an "unexamined published Japanese patent application"). However, this composition is insufficient in terms of display brightness.

To improve the display brightness of the PDP, it is necessary to cause a phosphor to emit light efficiently with limited energy. One of the methods for attaining this is to increase the surface area of a phosphor screen. As the method for increasing the surface area of a phosphor screen in a limited space such as a recess defined by partitions, there is proposed a method in which a phosphor screen is formed on a glass substrate and side surfaces of partitions (see JP-A 6-251703).

The radiation sensitive composition containing a dispersed phosphor used in JP-A 6-251703, however, is not satisfactory in terms of display quality as a PDP because it is difficult to form a uniform fluorescent screen extending from a glass substrate to side surfaces of partitions.

It is therefore an object of the present invention to provide a novel radiation sensitive composition containing a dispersed phosphor, which eliminates the defects of a conventional radiation sensitive composition containing a dispersed phosphor.

It is another object of the present invention to provide a radiation sensitive composition containing a dispersed phosphor, which facilitates the formation of a fine pattern, can form a uniform fluorescent screen on a substrate and side surfaces of partitions and can give a plasma display panel having a high display brightness.

Other objects and advantages of the present invention will become apparent from the following description.

According to the present invention, the above objects and advantages of the present invention can be attained by a radiation sensitive composition comprising (1) a phosphor, (2) an organic polymer binder comprising a combination of at least one alkali-soluble resin and at least one cellulose ether, (3) a photo-crosslinkable compound and (4) a photo-radical generating agent.

The present invention will be described below in detail.

(1) Phosphor

The phosphor used in the present invention is not limited to particular ones and may be suitably selected.

The phosphor is a phosphor for emitting a red light, green light or blue light.

Typical examples of the phosphors for emitting red light include $Y_2O_3$:Eu(III), $Y_2SiO_5$:Eu(III), $Y_3Al_5O_{12}$:Eu(III), $YVO_4$:Eu(III), $(Y,Gd)BO_3$:Eu(III), $Zn_3(PO_4)_2$:Mn and the like. They may be used alone or as an admixture of two or more.

Typical examples of the phosphors for emitting green light include $Zn_2SiO_4$:Mn, $BaAl_{12}O_{19}$:Mn, $BaMgAl_{14}O_{23}$:Mn, $LaPO_4$:(Ce,Tb), $Y_3(Al,Ga)_5O_{12}$:Tb and the like. They may be used alone or as an admixture of two or more.

Typical examples of the phosphors for emitting blue light include $Y_2SiO_5$:Ce, $BaMgAl_{10}O_{17}$:Eu(II), $BaMgAl_{14}O_{23}$:Eu(II), $(Ca,Sr,Ba)_{10}(PO_4)_6Cl_2$:Eu(II), (Zn, Cd)S:Ag and the like. They may be used alone or as an admixture of two or more.

The amount of the phosphor used is generally 10 to 2,000 parts by weight, preferably 20 to 1,500 parts by weight, based on 100 parts by weight of the later-described organic polymer binder (2). When the amount of the phosphor is less than 10 parts by weight, the density of the phosphor in the fluorescent screen will decrease and hence, sufficient display brightness cannot be obtained. On the other hand, when the amount exceeds 2,000 parts by weight, portions not exposed to radiation will be liable to have stains or a residual film thereon.

(2) Organic polymer binder

The organic polymer binder used in the present invention is a combination of at least one alkali-soluble resin and at least one cellulose ether. The term "alkali-soluble resin" as used herein means a resin different from cellulose ether. The term "alkali-soluble properties" as used herein means properties of having such a degree of solubility that a resin is dissolved in an alkali developer to be described later and the intended development is performed.

Preferred alkali-soluble resins include (meth)acrylic resins, hydroxystyrene resins, novolak resins and the like.

Of these alkali-soluble resins, particularly preferred are copolymers of the following monomers (A) and (B) and copolymers of the following monomers (A), (B) and (C).

The monomer (A) is a component for giving alkali solubility to the organic polymer binder, as exemplified by carboxyl group-containing monomers such as acrylic acid, methacrylic acid, maleic acid, fumaric acid, crotonic acid, itaconic acid, citraconic acid, mesaconic acid and cinnamic acid; hydroxyl group-containing monomers such as 2-hydroxyethyl (meth)acrylate, 2-hydroxypropyl (meth) acrylate and 3-hydroxypropyl (meth)acrylate; phenolic hydroxyl-group containing monomers such as o-hydroxystyrene, m-hydroxystyrene and p-hydroxystyrene; and other alkali-soluble functional group-containing monomers.

These monomers (A) may be used alone or as an admixture of two or more.

The monomer (B) is a component for adjusting the alkali solubility of the organic polymer binder, as exemplified by (meth)acrylic acid esters containing no hydroxyl group such as methyl (meth)acrylate, ethyl (meth)acrylate, n-propyl (meth)acrylate, i-propyl (meth)acrylate, n-butyl (meth) acrylate, i-butyl (meth)acrylate, sec-butyl (meth)acrylate, t-butyl (meth)acrylate, benzyl (meth)acrylate and glycidyl (meth)acrylate; aromatic vinyl monomers such as styrene and a-methyl styrene; conjugated dienes such as 1,3-butadiene and isoprene; and the like.

These monomers (B) may be used alone or as an admixture of two or more.

The monomer (C) is a component for giving the property of enhancing compatibility with the phosphor or the like to the organic polymer binder. Examples thereof include macromonomers having a polymerizable unsaturated group such as (meth)acryloyl group at one terminal of a polymer chain, such as polystyrene, polymethyl (meth)acrylate, polyethyl (meth)acrylate and polybenzyl (meth)acrylate.

These monomers (C) may be used alone or as an admixture of two or more.

The content of monomer units derived from the monomer (A) as recurring units contained in the above copolymer is preferably 10 to 90 wt %, more preferably 20 to 80 wt %, of the whole copolymer. If the content of monomer units derived from the monomer (A) is less than 10 wt %, the solubility of the organic polymer binder in an alkali developer will lower, whereby portions not exposed to radiation will be liable to have stains or a residual film thereon. On the other hand, if the content of monomer units derived from the monomer (A) exceeds 90 wt %, the solubility of the organic polymer binder in the alkali developer will be excessively high, whereby the fluorescent screen will be liable to fall off from the substrate.

The weight average molecular weight (to be referred to as "Mw" hereinafter) in terms of polystyrene, measured by a gel permeation chromatography (GPC, carrier: tetrahydrofuran), of the alkali-soluble resin is preferably 10,000 to 1,000,000, more preferably 20,000 to 700,000. If the Mw of the alkali-soluble resin is less than 10,000, the interval of development time giving the optimum development will be narrowed, that is, a development margin will be liable to become small. On the other hand, if the Mw is more than 1,000,000, scum tends to generate around a portion exposed to radiation after development, whereby pattern edge sharpness will be apt to be insufficient and portions not exposed to radiation will be liable to have stains or a residual film thereon.

Illustrative examples of the cellulose ether used in combination with the alkali-soluble resin include methyl cellulose, ethyl cellulose, hydroxymethyl cellulose, 2-hydroxyethyl cellulose, 2-hydroxypropyl cellulose, 2-hydroxyethyl.methyl cellulose, 2-hydroxyethyl.ethyl cellulose, 2-hydroxypropyl.methyl cellulose, 2-hydroxypropyl.ethyl cellulose, carboxymethyl cellulose and the like.

The Mw of the cellulose ether is generally 10,000 to 1,000,000, preferably 20,000 to 500,000. When the Mw is less than 10,000, it will be difficult to form a uniform phosphor layer on the side surfaces of partitions, whereas when the Mw is more than 1,000,000, portions not exposed to radiation will readily have a residual film therein after development.

The organic polymer binder (2) preferably comprises a combination of an alkali-soluble resin and cellulose ether in a weight ratio (the resin:the ether) of 10:1 to 10:30, more preferably 10:2 to 10:20.

(3) Photo-crosslinkable compound

The photo-crosslinkable compound is a compound which has a photo-sensitive group and can be crosslinked when exposed to radiation. The photo-sensitive group is a carbon-carbon unsaturated group, azido group or the like. The photo-crosslinkable compound can be a photo-crosslinkable monomer or oligomer.

Illustrative examples of the photo-crosslinkable compound include di(meth)acrylates of alkylene glycol such as ethylene glycol and propylene glycol; di(meth)acrylates of polyalkylene glycol such as polyethylene glycol and polypropylene glycol; polyvalent (meth)acrylates of polyvalent hydroxy compounds such as glycerine, trimethylolpropane, pentaerythritol, dipentaerythritol and trishydroxyethyl phosphate; oligo(meth)acrylates such as polyesters, epoxy resins, urethane resins, alkyd resins, silicone resins and spirane resins; di(meth)acrylates of polymers having hydroxyl groups at both terminals, such as di(meth)acrylates of polybutadiene having hydroxyl groups at both terminals, of polyisoprene having hydroxyl groups at both terminals and of polycaprolactone having hydroxyl groups at both terminals; (co)polymer resins of 4-(meth) acryloylphenylcinnamoyl esters; condensates of 4-azidobenzaldehyde with a hydroxyl group-containing resin such as polyvinyl alcohol or phenol novolak resin; and the like. In the present description, "polyvalent (meth) acrylate" denotes a compound having a plurality of (meth) acrylate groups.

Of these photo-crosslinkable compounds, polyvalent (meth)acrylates of polyvalent hydroxy compounds are particularly preferred, as exemplified by tripropylene glycol di(meth)acrylate, trimethylolpropane tri(meth)acrylate, pentaerythritol tri (meth)acrylate, pentaerythritol tetra(meth) acrylate, dipentaerythritol penta(meth)acrylate, dipentaerythritol hexa(meth)acrylate, tris(meth)acryloyloxyethyl phosphate and the like.

These photo-crosslinkable compounds may be used alone or as an admixture of two or more.

The amount of the photo-crosslinkable compound used is preferably 5 to 500 parts by weight, particularly preferably 20 to 200 parts by weight, based on 100 parts by weight of the organic polymer binder (2). When the amount is less than 5 parts by weight, the fluorescent screen will be liable to fall off from the substrate, whereas when the amount is more than 500 parts by weight, portions not exposed to radiation will be liable to have stains or a residual film thereon.

(4) Photo-radical generating agent

Known photo-radical generating agents can be used as the photo-radical generating agent in the present invention. Illustrative examples of the photo-radical generating agent include benzyl, benzoin, 2-benzyl-2-dimethylamino-1-(4-morpholinophenyl) butanone-1, 2-hydroxy-1-methyl-1-phenylpropanone-1, 1-(4-isopropylphenyl)-2-hydroxy-2-methylpropanone-1, 4-(2-hydroxyethoxy)phenyl-(2-hydroxy-2-propyl) ketone, 1-hydroxycyclohexylphenyl ketone, 2,2-dimethoxy-2-phenylacetophenone, 2-methyl-(4-methylthiophenyl)-2-morpholino-1-propanone-1, benzophenone, 4,4'-bis(dimethylamino)benzophenone, 4,4'-bis (diethylamino)benzophenone, 3,3-dimethyl-4-methoxybenzophenone, 1,7-bis(9-acridinyl)heptane, 4-azidobenzaldehyde, 4-azidoacetophenone, 4-azidobenzalacetophenone, azidopyrene, 4-diazodiphenylamine, 4-diazo-4'-methoxydiphenylamine, 4-diazo-3-methoxydiphenylamine, 4-azidobenzalacetone, 4-diazo-3'-methoxydiphenylamine, diazidocalcon, 2,6-bis (4'-azidobenzal)cyclohexanone, 2,6-bis(4'-azidobenzal)-4-methylcyclohexanone, 1,3-bis(4'-azidobenzal)-2-propanone, 1,3-bis(4'-azidocinnamylidene)propanone-2,4, 4'-diazidostilbene, 2,4-diethylthioxanthone, bis(2,6-dimethoxybenzoyl)-2,4,4-trimethylpentylphosphine oxide, benzointhio-i-butyl ether, N-phenylthioacridine, triphenylpyrylium perchlorate, 1,3-bis(trichloromethyl)-5-(2'-chlorophenyl)-s-triazine, 1,3-bis(trichloromethyl)-5-(4'-methoxyphenyl)-s-triazine, 2-[(2'-furyl)vinylene]-4,6-bis (trichloromethyl)-s-triazine, 2-[(5'-methyl-2'-furyl) vinylene]-4,6-bis(trichloromethyl)-s-triazine, 1,3-bis (trichloromethyl)-5-(4'-chlorophenyl)-s-triazine, 1,3-bis (trichloromethyl)-5-(2'-methoxyphenyl)-s-triazine, 2,2'-bis (2-chlorophenyl)-4,4',5,5'-tetraphenyl-1,2'-biimidazole, 2,2'-bis(2,4-dichlorophenyl)-4,4', 5,5'-tetraphenyl-1,2'-biimidazole, 2-mercaptobenzothiazole, 2-mercaptobenzooxazole, 2-mercaptobenzoimidazole, 2-mercapto-4(3H)-quinazoline, thioxanthone, substituted thioxanthone, and the like. Ilustrative examples of the substituted thioxanthone include 2-chlorothioxanthone, 2-methylthioxanthone, 2-ethylthioxanthone, 2-n-propylthioxanthone, 2-i-propylthioxanthone, 2,4-dichlorothioxanthone, 2,4-dimethylthioxanthone, 2,4-diethylthioxanthone, and the like.

These photo-radical generating agents can be used alone or as an admixture of two or more.

The amount of the photo-radical generating agent used is preferably 5 to 500 parts by weight, more preferably 10 to 400 parts by weight, based on 100 parts by weight of the photo-crosslinkable compound (3). When the amount of the photo-radical generating agent is less than 5 parts by weight, a crosslinking reaction cannot proceed completely due to exposure to radiation, whereby a pixel pattern may undergo undercut. On the other hand, when the amount is more than 500 parts by weight, pixels may fall off from the substrate at the time of development or portions not exposed to radiation will be liable to have stains or a residual film thereon.

Additives

The radiation sensitive composition containing a dispersed phosphor, provided by the present invention, may contain various additives such as a thermosetting resin, curing catalyst for thermosetting resins, adhesion promoting agent, filler, surfactant, antioxidant, ultraviolet absorber, agglomeration preventing agent and the like as required, in addition to the above components (1) to (4).

Illustrative examples of the thermosetting resin include epoxy resins, melamine resins, urea resins, aniline resins, phenol resins, unsaturated polyester resins, acrylate resins and the like.

Illustrative examples of the curing catalyst for thermosetting resins include polyamines, acid anhydrides, antimony fluoride compounds and the like for epoxy resins; ammonium salts, alcohol amines, metal salts, organic acids and the like for melamine resins, urea resins and aniline resins; peroxides such as benzoyl peroxide and methyl ethyl ketone peroxide for unsaturated polyester resins; and azo compounds such as azoisobutyronitrile and azoisovaleronitrile, benzyls such as p,p'-dimethoxybenzyl and p,p'-dichlorobenzyl, and acetophenones such as 2,2-diethoxyacetophenone and 2,2-dimethyl-2-hydroxyacetophenone for acrylate resins.

Illustrative examples of the adhesion promoting agent include vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl) ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane and the like.

Illustrative examples of the filler include low-melting glass, alumina, silica and the like.

Illustrative examples of the surfactant include nonionic surfactants, cationic surfactants, anionic surfactants and the like.

Illustrative examples of the antioxidant include 2,2-thiobis (4-methyl-6-t-butylphenol), 2,6-di-t-butylphenol and the like.

Illustrative examples of the ultraviolet absorber include 2-(3-t-butyl-5-methyl-2-hydroxyphenyl)-5-chlorobenzotriazole, alkoxybenzophenone and the like.

Illustrative examples of the agglomeration preventing agent include sodium polyacrylate, polyethylene glycol and the like.

In addition, a curing promoting agent, inorganic pigment, organic pigment, dye and the like can be blended.

The above additives may be used alone or as an admixture of two or more.

Solvent

The radiation sensitive composition containing a dispersed phosphor, provided by the present invention, comprises the components (1) to (4) as essential ingredients and the above additives as the case may be, as described above. As required, the composition further may contain a solvent.

The solvent is preferably a solvent containing at least N-methyl-2-pyrrolidone. In this case, to adjust the evaporation rate and viscosity of the solvent at the time when a coating film is formed from the composition, it may further contain a solvent other than N-methyl-2-pyrrolidone.

The solvent other than N-methyl-2-pyrrolidone is selected from ethers, esters, ether esters, ketones, ketone esters, amides, amide esters, lactams, lactones, sulfoxides, sulfones, (halogenated) hydrocarbons and the like. That is, illustrative examples of the solvent include tetrahydrofuran, anisole, dioxane, ethylene glycol monoalkyl ethers, ethylene glycol dialkyl ethers, diethylene glycol monoalkyl ethers, diethylene glycol dialkyl ethers, propylene glycol monoalkyl ethers, propylene glycol dialkyl ethers, acetic esters, hydroxyacetic esters, alkoxyacetic esters, propionic esters, hydroxypropionic esters, alkoxypropionic esters, lactic esters, ethylene glycol monoalkyl ether acetates, diethylene glycol monoalkyl ether acetates, propylene glycol monoalkyl ether acetates, cyclic and noncyclic ketones, acetoacetic esters, pyruvic esters, N,N-dialkylformamides, N,N-dialkylacetamides, γ-lactones, dialkyl sulfoxides, dialkyl sulfones, α-terpineols, a mixture of ethanol and water, and the like.

These solvents may be used alone or as an admixture of two or more.

The amount of the solvent used is preferably 5 to 1,000 parts by weight, more preferably 10 to 500 parts by weight, based on 100 parts by weight of the whole solid content of the radiation sensitive composition containing a dispersed phosphor.

The radiation sensitive composition containing a dispersed phosphor according to the present invention can be prepared by mixing the above components (1) to (4) together with an additive(s) which may be optionally added and a solvent as required, using a mixer such as a ball mill, pebble mill, shaker, homogenizer, 3-roll mill, sand mill or the like.

The radiation sensitive composition containing a dispersed phosphor according to the present invention can be very advantageously used to form a fluorescent screen for a plasma display panel.

The plasma display panel has display electrodes and partitions for defining a discharge space on a substrate such as a glass substrate, for example. A recess between adjacent partitions is filled with a phosphor layer composed of the radiation sensitive composition containing a dispersed phosphor of the present invention by screen printing, for example, phosphor layer is irradiated with light through a mask, developed using an alkali developer and baked to form a fluorescent screen.

The radiation used for the production of the plasma display panel is preferably visible light, ultraviolet light or far ultraviolet light, for example. Irradiation conditions including irradiation dose are suitably selected according to the blending composition of the composition.

The baking conditions include a heating temperature of preferably 300 to 800° C., more preferably 400 to 600° C. and a heating time of preferably 1 to 360 minutes, more preferably 10 to 240 minutes.

The alkali developer used in the production of the plasma display panel is preferably an aqueous solution of an alkaline compound such as sodium hydroxide, potassium hydroxide, sodium carbonate or tetramethyl ammonium hydroxide.

The concentration of the alkaline compound in the aqueous solution is preferably 0.01 to 5 wt %, more preferably 0.02 to 3 wt %. To the developer composed of the aqueous solution of the alkaline compound may be added a water-soluble organic solvent such as methanol or ethanol, a surfactant and the like in suitable amounts. When a developer composed of an aqueous solution of an alkaline compound is used, the plasma display panel is generally washed with water after development.

The following examples are provided for the purpose of further illustrating the present invention but are in no way to be taken as limiting. "%" and "parts" means % by weight and parts by weight, respectively.

SYNTHESIS EXAMPLE 1

A mixture comprising 100 parts of N-methyl-2-pyrrolidone, 75 parts of methyl methacrylate, 25 parts of methacrylic acid and 1 part of azoisobutyronitrile was charged into an autoclave equipped with a stirrer, stirred at room temperature until it became a uniform mixture, and the temperature was elevated to 80° C. Then, the mixture was polymerized at 80° C. for 3 hours, further polymerized at 100° C. for 2 hours and cooled to room temperature to obtain a polymer solution. During polymerization, air cutoff by nitrogen and stirring were kept. The polymerization yield of the obtained polymer (to be referred to as "polymer a") was 98% and the Mw, measured by GPC (trade name: HLC-802A) of Tosoh Corporation, of the polymer a was 150,000.

SYNTHESIS EXAMPLE 2

A mixture comprising 100 parts of N-methyl-2-pyrrolidone, 50 parts of n-butyl methacrylate, 25 parts of methacrylic acid, 25 parts of 2-hydroxypropyl methacrylate and 1 part of azoisobutyronitrile was charged into an autoclave equipped with a stirrer, stirred at room temperature until it became a uniform mixture, and the temperature was elevated to 80° C. Then, the mixture was polymerized at 80° C. for 3 hours, further polymerized at 100° C. for 2 hours and cooled to room temperature to obtain a polymer solution. During polymerization, air cutoff by nitrogen and stirring were kept. The polymerization yield of the obtained polymer (to be referred to as "polymer b") was 98% and the Mw, measured by GPC (trade name: HLC-802A) of Tosoh Corporation, of the polymer b was 100,000.

Example 1

A radiation sensitive composition containing a dispersed phosphor shown below was coated, by a screen printing, onto a glass substrate having a thickness of 2.0 mm and predetermined electrodes and ribs (partitions) and then, dried in a clean oven heated at 110° C. to form a phosphor layer.

| Radiation sensitive composition containing a dispersed phosphor | |
| --- | --- |
| phosphor | |
| (Y,Gd)BO$_3$:Eu (red) | 40 parts |
| organic polymer binder | |
| (1) alkali-soluble resin | 4 parts |
| polymer a (synthesis example 1) | |
| (2) cellulose ether | 1.5 parts |
| 2-hydroxypropyl cellulose (Mw = 300,000) | |
| photo-crosslinkable monomer | |
| pentaerythritol triacrylate | 4 parts |
| photo-radical generating agent | |
| 2,2'-bis(2,4-dichlorophenyl)-4,4',5,5'-tetraphenyl-1,2'-biimidazole (to be referred to as "component α") | 1 part |
| 4,4'-diethylaminobenzophenone | 1 part |
| 2-mercaptobenzothiazole | 0.5 part |
| solvent | |
| N-methyl-2-pyrrolidone | 48 parts |

The obtained phosphor layer having a thickness of about 30 μm was formed uniformly on the side surfaces and bottom surface of the rib. The phosphor layer was irradiated with 200 mJ/cm$^2$ of ultraviolet light (i-ray having a wavelength of 365 nm) by an ultrahigh pressure mercury lamp through a mask. Then, it was developed with a 0.05% aqueous solution of potassium hydroxide (pH of 11.7) for 2 minutes, washed with a shower of ultrapure water for 1 minute to remove portions not exposed to ultraviolet light of the phosphor layer, and dried in the air. Thereafter, it was heated in a clean oven at 230° C. for 30 minutes and baked in a kiln at 500° C. for 30 minutes to form a fluorescent screen for emitting light. Thus, a plasma display panel was obtained.

The obtained plasma display panel had an about 25 μm thick fluorescent screen. The fluorescent screen was uniformly formed on the glass substrate and side surfaces of partitions, and exhibited a high display brightness during operation.

The results are shown in Table 1.

Examples 2 and 3

Radiation sensitive compositions containing a dispersed phosphor were prepared and plasma display panels were obtained in the same manner as in Example 1 except that components shown in Table 1 were used. The component β used as a photo-radical generating agent in Example 2 was 2-methyl-(4-methylthiophenyl)-2-morpholinopropanone-1.

The obtained plasma display panels had an about 25 μm thick fluorescent screen and an about 30 μm thick fluorescent screen, respectively. These fluorescent screens were formed uniformly on the glass substrate and side surfaces of partitions, and exhibited a high display brightness during operation.

The results are shown in Table 1.

TABLE 1

| | Examples | | |
| --- | --- | --- | --- |
| | 1 | 2 | 3 |
| Phosphor | (Y,Gd)BO$_3$: Eu(III) | Zn$_2$SiO$_4$: Mn | BaMgAl$_{14}$O$_{23}$: Eu(II) |
| Organic polymer binder | Polymer a 2-hydroxypropyl cellulose (Mw = 300,000) | Polymer a 2-hydroxyethyl.methyl cellulose (Mw = 400,000) | Polymer b 2-hydroxypropyl.methyl cellulose (Mw = 400,000) |
| Photo-crosslinkable monomer | Pentaerythritol triacrylate | Pentaerythritol triacrylate | Dipentaerythritol pentaacrylate |
| Photo-radical generating agent: | Component α 4,4'-diethylaminobenzophenone 2-mercaptobenzothiazole | Component β — — | Component α 4,4'-diethylaminobenzophenone 2-mercaptobenzothiazole |
| Solvent | N-methyl-2-pyrrolidone | N-methyl-2-pyrrolidone | N-methyl-2-pyrrolidone |
| Evaluation Thickness of fluorescent screen Shape of fluorescent screen | About 25 μm 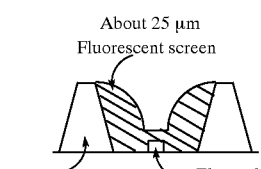 | About 25 μm  | About 30 μm 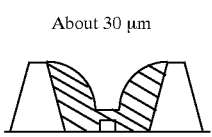 |

Examples 4 and 5

Radiation sensitive compositions containing a dispersed phosphor were prepared and plasma display panels were obtained in the same manner as in Example 1 except that components shown in Table 2 were used. The component β used as a photo-radical generating agent in Example 5 was 2-methyl-(4-methylthiophenyl)-2-morpholinopropanone-1.

The obtained plasma display panels had an about 25 μm thick fluorescent screen. The fluorescent screen was formed uniformly on the glass substrate and side surfaces of partitions, and exhibited a high display brightness during operation.

The results are shown in Table 2.

Comparative Examples 1 and 2

Radiation sensitive compositions containing a dispersed phosphor were prepared and plasma display panels were obtained in the same manner as in Example 1 except that components shown in Table 2 were used. As a result, the plasma display panel of Comparative Example 1 had an about 30 μm thick fluorescent screen. However, the fluorescent screen was formed only on the glass substrate but not on the side surfaces of partitions, and exhibited a low display brightness during operation.

In the case of the radiation sensitive composition containing a dispersed phosphor of Comparative Example 2, portions not exposed to radiation were not dissolved in a 0.05% potassium hydroxide aqueous solution (pH of 11.7).

The results are shown in Table 2.

TABLE 2

| | Examples | | Comparative Examples | |
| --- | --- | --- | --- | --- |
| | 4 | 5 | 1 | 2 |
| Phosphor | (Y,Gd)BO$_3$: Eu(III) | Zn$_2$SiO$_4$: Mn | Zn$_2$SiO$_4$: Mn | BaMgAl$_{14}$O$_{23}$: Eu(II) |
| Organic polymer binder | Polymer b 2-hydroxypropyl.methyl cellulose (Mw = 400,000) | Polymer a 2-hydroxypropyl.methyl cellulose (Mw = 400,000) | Polymer a — | — 2-hydroxy-propyl.methyl cellulose (Mw = 400,000) |
| Photo-crosslinkable monomer | Dipentaerythritol pentaacrylate | Dipentaerythritol pentaacrylate | Pentaerythritol triacrylate | Dipentaerythritol pentaacrylate |
| Photo-radical generating agent | Component α 4,4'-diethylaminobenzo-phenone 2-mercaptobenzothiazole | Component β 4,4'-diethylaminobenzo-phenone Thioxanthone | Component α 4,4'-diethylaminobenzo-phenone 2-mercaptobenzothiazole | Component β — — |
| Solvent | N-methyl-2-pyrrolidone 60% α-terpineol 40% | N-methyl-2-pyrrolidone | N-methyl-2-pyrrolidone | N-methyl-2-pyrrolidone |
| Evaluation Thickness of Fluorescent screen Shape of fluorescent screen | About 25 μm  | About 25 μm  | About 30 μm  | Development with alkali developer impossible |

The radiation sensitive composition containing a dispersed phosphor of the present invention makes it possible to form a fine pattern by a development treatment using an alkali developer with ease and form an uniform fluorescent screen on a substrate and the side surfaces of partitions, and to provide a plasma display panel having a high display brightness. Therefore, the radiation sensitive composition containing a dispersed phosphor of the present invention greatly contributes to an increase in the size of a plasma display panel and progress in the formation of a fine pattern for the panel.

What is claimed is:

1. A radiation sensitive composition comprising:

(1) a phosphor;

(2) an organic polymer binder comprising a combination of at least one alkali-soluble resin and at least one cellulose ether;

(3) a photo-crosslinkable compound; and (4) a photo-radical generating agent, wherein said cellulose ether is selected from the group consisting of 2-hydroxypropyl cellulose, 2-hydroxyethyl.methyl cellulose and 2-hydroxypropyl.methyl cellulose.

2. The radiation sensitive composition of claim 1, wherein the alkali-soluble resin is selected from the group consisting of (meth)acrylic resins, hydroxystyrene resins and novolak resins.

3. The radiation sensitive composition of claim 1, wherein the alkali-soluble resin is a copolymer containing 10 to 90 wt % of an alkali-soluble monomer as a copolymerizable component.

4. The radiation sensitive composition of claim 1, wherein the organic polymer binder comprises an alkali-soluble resin and cellulose ether in a weight ratio of 10:1 to 10:30.

5. The radiation sensitive composition of claim 1, wherein the photo-crosslinkable compound is a polyvalent (meth)acrylate of a polyvalent hydroxy compound.

6. The radiation sensitive composition of claim 1 which comprises 10 to 2,000 parts by weight of the phosphor based on 100 parts by weight of the organic polymer binder.

7. The radiation sensitive composition of claim 1 which comprises 5 to 500 parts by weight of the photo-crosslinkable compound based on 100 parts by weight of the organic polymer binder.

8. The radiation sensitive composition of claim 1 which comprises 5 to 500 parts by weight of the photo-radical generating agent based on 100 parts by weight of the photo-crosslinkable compound.

9. The radiation sensitive composition of claim 1 which further comprises a solvent.

* * * * *